(12) United States Patent
Sakuma et al.

(10) Patent No.: US 11,973,058 B2
(45) Date of Patent: Apr. 30, 2024

(54) MULTIPLE DIE ASSEMBLY

(71) Applicant: International Business Machines Corporation, Armonk, NY (US)

(72) Inventors: Katsuyuki Sakuma, Fishkill, NY (US); Mukta Ghate Farooq, Hopewell Jct, NY (US); John Knickerbocker, Monroe, NY (US)

(73) Assignee: International Business Machines Corporation, Armonk, NY (US)

( * ) Notice: Subject to any disclaimer, the term of this patent is extended or adjusted under 35 U.S.C. 154(b) by 351 days.

(21) Appl. No.: 17/535,664

(22) Filed: Nov. 25, 2021

(65) Prior Publication Data

US 2023/0163100 A1 May 25, 2023

(51) Int. Cl.
*H01L 25/065* (2023.01)
*H01L 21/56* (2006.01)
(Continued)

(52) U.S. Cl.
CPC ........ *H01L 25/0655* (2013.01); *H01L 21/561* (2013.01); *H01L 21/568* (2013.01);
(Continued)

(58) Field of Classification Search
CPC . H01L 25/0655; H01L 21/561; H01L 21/568; H01L 23/053; H01L 23/36; H01L 23/5383
See application file for complete search history.

(56) References Cited

U.S. PATENT DOCUMENTS 8,389,337 B2   3/2013 Roberts et al.
9,373,559 B2   6/2016 Brofman et al.
(Continued)

OTHER PUBLICATIONS

John H. Lau, Recent Advances and Trends in Fan-Out Wafer/Panel-Level Packaging, ASM Pacific Technology, Hong Kong, China, Journal of Electronic Packaging, 2019 by ASME, Dec. 2019, vol. 141/ 040801-1.

(Continued)

*Primary Examiner* — Thao P Le
(74) *Attorney, Agent, or Firm* — Michael O'Keefe

(57) ABSTRACT

A semiconductor die package that has a substrate with one or more substrate layers with one or more substrate connections. A substrate layer can include one or more redistribution layers (RDLs). One or more dies (e.g., multiple dies) are disposed on a top substrate layer. The dies have one or more die external connections. Some of the die external connections are electrically connected to one or more substrate connections. One or more metallic dam stiffeners form into a dam enclosure that is disposed on and physically connected to the top substrate layer. The dam enclosure encloses one or more of the dies. The metallic dam enclosure has one or more electrically connected regions where the metallic dam enclosure is electrically connected to one or more of the substrate horizontal connections and one or more electrically insulated regions where the metallic dam enclosure is electrically insulated from one or more of the substrate horizontal connections and the substrate via connections. In different embodiments, the dam enclosure stiffens the substrates/package during manufacture, assembly, and operation; provides confinement for underfill application; and provides a heat conduction path for heat removal. Methods of manufacturing and assembling the die package are disclosed.

20 Claims, 9 Drawing Sheets

(51) Int. Cl.
*H01L 23/00* (2006.01)
*H01L 23/053* (2006.01)
*H01L 23/36* (2006.01)
*H01L 23/538* (2006.01)
*H01L 25/00* (2006.01)

(52) U.S. Cl.
CPC ............ *H01L 23/053* (2013.01); *H01L 23/36* (2013.01); *H01L 23/5383* (2013.01); *H01L 23/5384* (2013.01); *H01L 23/5386* (2013.01); *H01L 23/562* (2013.01); *H01L 24/08* (2013.01); *H01L 25/50* (2013.01); *H01L 2224/08225* (2013.01)

(56) References Cited

U.S. PATENT DOCUMENTS

| | | | |
|---|---|---|---|
| 9,520,333 | B1 | 12/2016 | Shih et al. |
| 9,860,996 | B2 | 1/2018 | Interrante et al. |
| 9,875,986 | B2 | 1/2018 | Sakuma et al. |
| 9,935,090 | B2 | 4/2018 | Yu et al. |
| 10,049,953 | B2 | 8/2018 | Yu et al. |
| 10,269,767 | B2 | 4/2019 | Chen et al. |
| 10,541,156 | B1 | 1/2020 | Interrante et al. |
| 10,764,996 | B1 | 9/2020 | Boja |
| 2002/0060084 | A1 | 5/2002 | Hilton et al. |
| 2004/0256734 | A1* | 12/2004 | Farnworth ............. H01L 24/16 257/E21.705 |
| 2011/0147912 | A1 | 6/2011 | Karpur et al. |
| 2012/0120613 | A1 | 5/2012 | Kuwabara |
| 2017/0110419 | A1 | 4/2017 | Shih et al. |
| 2017/0287871 | A1 | 10/2017 | Lu |
| 2018/0182718 | A1 | 6/2018 | Karhade |
| 2020/0006166 | A1 | 1/2020 | Raorane |
| 2020/0006289 | A1 | 1/2020 | Chang |
| 2020/0377772 | A1 | 12/2020 | Kamada |
| 2021/0134724 | A1 | 5/2021 | Rubin et al. |
| 2022/0059420 | A1* | 2/2022 | Ryu ................... H01L 25/0655 |
| 2022/0157777 | A1* | 5/2022 | Yang .................... H01L 21/563 |
| 2023/0187329 | A1* | 6/2023 | Jang .................... H01L 23/5386 257/692 |
| 2023/0317671 | A1* | 10/2023 | Hsu ........................ H01L 24/20 |
| 2023/0386946 | A1* | 11/2023 | Chen ...................... H01L 24/13 |

OTHER PUBLICATIONS www.imec-int.com/en/imec-magazine/imec-magazine-jun-2019/a-new-approach-to-fan-out-wafer-level-packaging; IMEC; "A new approach to fan-out wafer-level packaging".

WonMyoung Ki, et al., "Chip Stackable, Ultra-thin, High-flexibility 3D FOWLP (3D Swift Technology) for Hetero-integrated Advanced 3D WL-SIP", 2018 IEEE 68th Electronic Components and Technology Conference.

"Patent Cooperation Treaty PCT International Search Report", Applicant's File Reference: P202100833PCT01, International Application No. PCT/IB2022/061279, International Filing Date: Nov. 22, 2022, Date of Mailing: Mar. 6, 2023, 16 pages.

Wong et al.: "Fast-Flow Underfill Encapsulant: Flow Rate and Coefficient of Thermal Expansion", IEEE Transactions On Components, Packaging, and Manufacturing Technology-Part A, vol. 21, No. 2, Jun. 1998, 5 Pages.

* cited by examiner

MULTIPLE DIE ASSEMBLY

BACKGROUND

The present invention relates to packages of semiconductor circuitry, i.e., semiconductor chip/die packages. More specifically, the invention relates to improving the structural integrity, reliability, and operation of die packages containing multiple dies.

The function and utility of die packages can be increased by increasing the number of dies within the die package. Accordingly, a greater number of functions can be contained in a die package with multiple dies while maintaining an overall small die package footprint.

However, as the number of dies in a die package increases, the number and complexity of interconnections between the dies and other components within the package also increases. Manufacturing problems arise as the number of dies increases in a die package. These difficulties are harder to address as the size of dies and other components decreases.

Semiconductor chips or dies contain huge numbers of internal electrical components and circuitry (like die devices within the die) and are well known. Generally, the dies have a plurality of electrical die external connections, including C4/solder bump connections and/or conductive/metal, e.g., copper, pad connections.

Some of the die external connections are electrically and physically connected to one or more corresponding substrate external connections on one or more substrates within each die package. Substrates can be made of materials such as epoxy, resin, dielectric polymer, polyimide, polyimide alloy or compounds, ceramic, silicon, and/or other similar materials. Substrates can also be made from laminates. The substrates organize, hold, and carry the dies (and other components) attached to (and sometimes within) the respective substrates. Two or more of these substrates are physically arranged, aligned, and connected to form a die package.

In the die package, the die external connections are connected to corresponding substrate external connections on one or more substrates within the package, e.g., with hybrid bonding or Cu—Cu direct bonding or micro-bump solder bonding or C4 solder ball reflow bonding. Substrate internal connections within the substrate layers electrically connect to respective substrate external connections on the package to enable electrical interconnections between/among: i. die devices within the internal die circuitry (of two or more dies), ii. substrate circuitry within the substrates, iii. substrate components within or attached to the substrates of the package, and/or iv. external circuitry connected through package external connections. In some embodiments, package external connections are instantiations of substrate external connections.

Some die packages have one or more redistribution layers (RDLs). A RDL is a metalized layer within a substrate. One function of a RDL is to "fan out" contacts of one or more of the dies. The RDL enables this fan out by having RDL connections that connect one or more of the die external connections to respective substrate external connections that are outside the projected footprint of the die on the substrate. Therefore, the fan out enables connection to one or more of the die external connections to be available at more substrate external locations away from the die, e.g., at one or more locations on the substrate that are not underneath the respective die. These fanned out connections permit more and easier connections to the die external connections and at more accessible locations on the substrate. Fan out connections are known.

As stated, one or more of the substrates in the die package have substrate external connections that are also package external connections. These package external connections connect the entire package to circuitry external to the package. Often die packages can be electrically and physically connected to and carried by other substrates like printed circuit boards, laminated substrates, etc.

As die packages contain more circuitry (higher circuit density), e.g., as component and die sizes shrink, dimensions and clearances within die packages become smaller. In addition, die packages with high circuit density typically have thinner substrates within the die package. For example, RDL thicknesses can be between 1-200 microns with RDL connections in the RDL having a pitch between 1-50 microns.

Thinner substrates, thinner layers of the substrates (e.g., RDLs), and smaller dies and components are more fragile, difficult to handle, and subject to bending/distortion and/or cracking during assembly, manufacturing, and operation.

Circuits and functions within die packages also can be increased by increasing the surface area of the substrates and substrate layers (e.g., RDLs) within the die package. For a given substrate thickness, substrates within the die packages that have larger surface areas are even more fragile than those substrates with smaller surface areas. Accordingly, thinner layers of the substrates (e.g., RDLs) with larger surface areas are increasingly more fragile, difficult to handle, and subject to bending/distortion and/or cracking during both assembly/manufacturing and operation. Larger surface area substrates are encountered in wafer level manufacturing and assembly.

Deposition of package materials, like adhesives and underfills, is more difficult in die packages with small clearances. Uniform application of underfills and/or adhesive layers into small clearance spaces may require higher pressure application. Higher pressure puts mechanical stresses on substrate layers (like the RDLs) and/or components/dies within the die package. These mechanical stresses can damage the layers/components/dies during assembly/manufacturing of the die package and even later during die package operation particularly when dies and components are small and substrates are thin with larger areas. Applying higher pressures/forces tends to move components/dies on the substrate during the assembly/manufacturing of the die package which causes miss alignments; weak, poor, or no connections; and/or component interference problems. Distortion of substrates away from flatness can also cause these problems.

Thermal stresses are caused by thermal cycling of materials in the die packages during assembly/manufacture and operation. Package materials with different coefficients of thermal expansion expand at different rates during thermal/temperature cycling. These thermal stresses cause substrate/substrate layer bending and/or cracking that result die package assembly problems, poor connections, overall package failure, and shorter package lifetimes, etc. Again, these problems increase as the substrates become thinner, have larger areas, and the components/dies become smaller.

The prior art has addressed these issues by using stiffeners, material selection, molds to control underfill application, etc. However, there is a need to improve the prior art solutions as sizes and clearances become smaller, layers become thinner, the number of dies in packages increase, connections within packages become more complex, and substrate surface areas increase. There is a need to improve substrate stiffening and handling of substrates, components, and dies during die package manufacturing and assembly and a need to improve substrate stiffness, reduce stress levels, and improve heat reduction (to reduce thermal stresses) from die packages during operation.

SUMMARY

Embodiments of the present invention include a semiconductor die package that has a substrate with one or more substrate layers. One or more of the substrate layers has one or more substrate internal connections and one or more substrate external connections. The substrate connections include substrate horizontal connections and substrate via connections. The substrate has a top and bottom substrate layer.

A substrate or a substrate layer can include one or more redistribution layers (RDLs). Thus, each RDL is considered one of the substrate layers. The RDLs have one or more RDL connections that include RDL horizontal connections and RDL via connections. The RDL horizontal connections are substrate horizontal connections and the RDL via connections are substrate via connections. The substrate (RDL) horizontal connections can be either a substrate internal connection or a substrate external connection.

One or more semiconductor dies (dies) are disposed on the top substrate layer. In some embodiments, multiple dies are disposed on the top substrate layer. Each of the dies has one or more die external connections, e.g., a C4 solder ball connection and/or a metal pad connection. One or more of the die external connections are electrically connected to one or more of the substrate external connections, also called corresponding substrate connections. Examples of substrate external connections include micro-bump solder connections and/or C4 solder ball connections and/or a metal pad connections.

One or more metallic dam stiffeners form a dam enclosure that is disposed on and physically connected to the top substrate layer. The dam enclosure encloses one or more of the dies. The dam enclosure (e.g., metallic dam enclosure) has one or more electrically connected regions and one or more electrically insulated regions. The electrically connected regions are regions of the dam enclosure that are electrically and physically connected to one or more of the substrate horizontal connections. The electrically insulated regions are regions of the dam enclosure that are electrically insulated from one or more of the substrate horizontal connections, although there is a physical connection.

In some embodiments there are two underfill layers surrounding the dies and contained by the dam enclosure. A low viscosity underfill fills the clearances between one or more of the die bottom surfaces and the top substrate layer. A high viscosity underfill is disposed on the low viscosity underfill. In alternative embodiments, where there is a very small or no die clearance, there is no underfill between the die bottom surface and the top substrate layer.

Methods of manufacturing and assembling the die package are disclosed.

BRIEF DESCRIPTION OF THE DRAWINGS

Various embodiments of the present invention will be described below in more detail, with reference to the accompanying drawings, now briefly described. The Figures show various apparatus, structures, and related method steps of the present invention.

DETAILED DESCRIPTION

Figure 1:
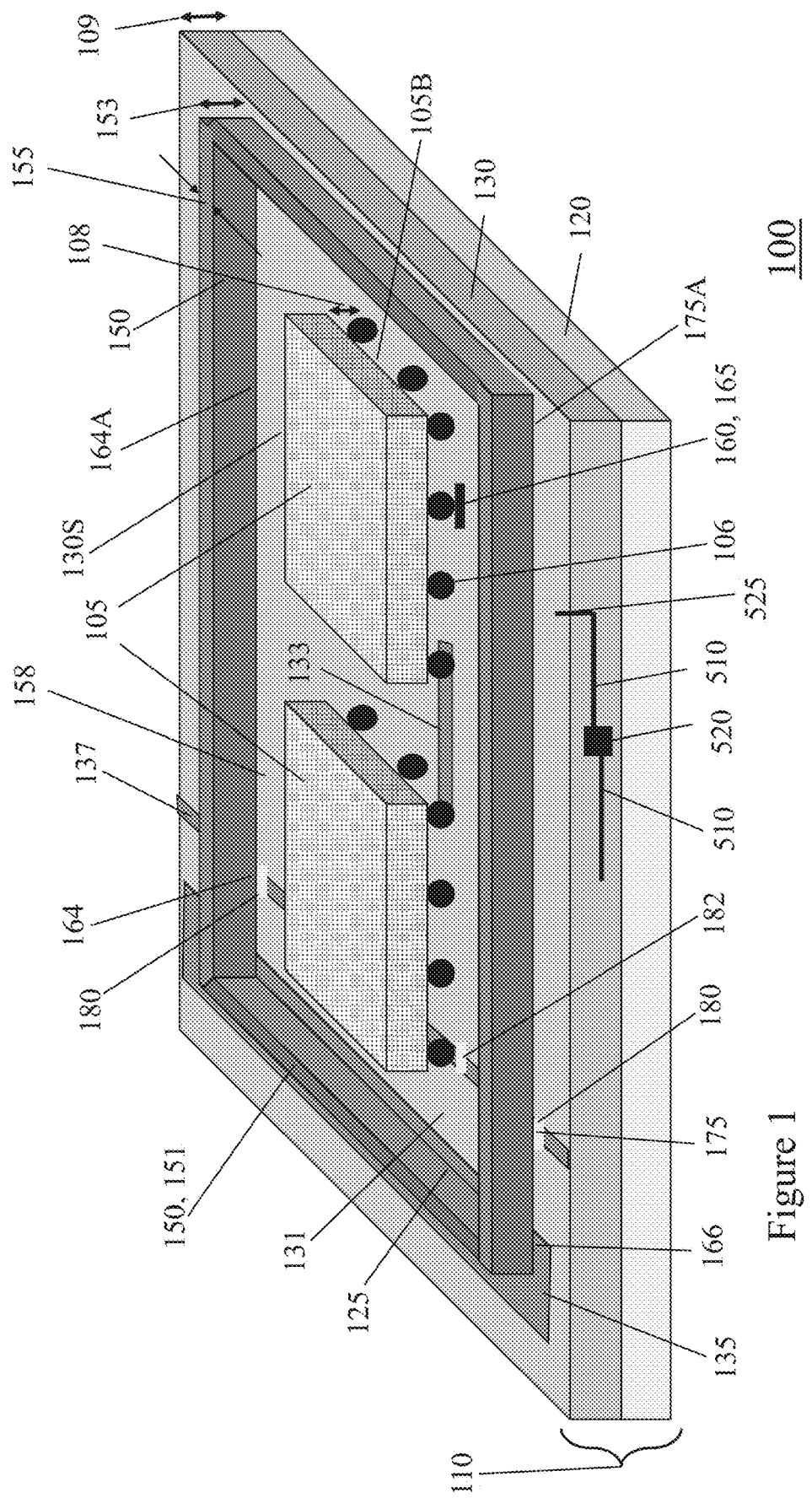
FIG. 1 is an isometric illustration of a multiple die assembly in an interim die package with a metallic dam enclosure/stiffener that is physically connected to a top substrate layer, e.g., a redistribution layers (RDL), where the metallic dam enclosure has one or more electrically connected regions and one or more electrically insulated regions.

It is to be understood that embodiments of the present invention are not limited to the illustrative methods, apparatus, structures, systems and devices disclosed herein but instead are more broadly applicable to other alternative and broader methods, apparatus, structures, systems and devices that become evident to those skilled in the art given this disclosure.

In addition, it is to be understood that the various layers, structures, and/or regions shown in the accompanying drawings are not drawn to scale, and that one or more layers, structures, and/or regions of a type commonly used may not be explicitly shown in a given drawing. This does not imply that the layers, structures, and/or regions not explicitly shown are omitted from the actual devices.

In addition, certain elements may be left out of a view for the sake of clarity and/or simplicity when explanations are not necessarily focused on such omitted elements. Moreover, the same or similar reference numbers used throughout the drawings are used to denote the same or similar features, elements, or structures, and thus, a detailed explanation of the same or similar features, elements, or structures may not be repeated for each of the drawings.

The semiconductor devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, neural networks, etc. Systems and hardware incorporating the semiconductor devices and structures are contemplated embodiments of the invention.

As used herein, "height" refers to a vertical size of an element (e.g., a layer, trench, hole, opening, etc.) in the cross-sectional or elevation views measured from a bottom surface to a top surface of the element, and/or measured with respect to a surface on which the element is located.

Conversely, a "depth" refers to a vertical size of an element (e.g., a layer, trench, hole, opening, etc.) in the cross-sectional or elevation views measured from a top surface to a bottom surface of the element. Terms such as "thick", "thickness", "thin" or derivatives thereof may be used in place of "height" where indicated.

As used herein, "lateral," "lateral side," "side," and "lateral surface" refer to a side surface of an element (e.g., a layer, opening, etc.), such as a left or right-side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the elevation views, and "horizontal" refers to a direction parallel to the top surface of the substrate in the elevation views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers, present between the first element and the second element.

It is understood that these terms might be affected by the orientation of the device described. For example, while the meaning of these descriptions might change if the device was rotated upside down, the descriptions remain valid because they describe relative relationships between features of the invention.

One or more metallic dam stiffeners form a dam enclosure disposed on and physically connected to a top substrate layer. The dam enclosure encloses one or more dies. The dam enclosure has one or more electrically connected regions and one or more electrically insulated regions. The electrically connected regions of the dam enclosure are electrically and physically connected to one or more of the substrate horizontal connections. The electrically insulated regions are electrically insulated from (but still physically connected to) one or more of the substrate horizontal connections. The dam enclosure stiffens the substrates and package during manufacture, assembly, and operation.

FIG. 1 is an isometric illustration of a multiple die 105 assembly in an interim die package 100 with a metallic dam enclosure 150 made from one or more stiffeners 151. The metallic dam enclosure 150 is physically connected to a top substrate layer 131, e.g., a RDL 130, where the metallic dam enclosure 150 has one or more electrically connected regions, e.g., 166 and one or more electrically insulated regions, e.g., 164/175/175A.

The die package has a substrate 110 with one or more substrate layers 120/130. (See also layers 120, 130, 502, 504, etc. in FIG. 5.) In many embodiments, metal layers (metal substrate layers) and dielectric layers (dielectric substrate layer) are alternately layered, one on top of the other. In some embodiments, spaces between and/or around wires, connections, or other metallic/conductive components are filled with dielectric/insulating material.

One or more of the substrate layers, 120/130/502/504, typically 120, has one or more substrate connections 135/133/137/510/525/160, typically 137. One or more of the substrate connections, typically 137, in one of the substrate layers is a substrate horizontal connection, e.g., 133, 135, 137/510. One or more of the substrate connections is a substrate vertical connection or a substrate via connection 525. Note that connections 135/137/160 are examples of substrate external connections while connections 510 are examples of substrate internal connections.

There is a top substrate layer 131 of the substrate 110. In instances where there is only one substrate layer 120, the top substrate layer 131 is the same as the substrate layer 120. In some embodiments, the top substrate layer 131 is a RDL 130.

In some embodiments, there is a small clearance 108 between a bottom surface 105B of the dies 105 and the top substrate layer 131. The clearance 108 is caused by the height of some types of die external connections 106, e.g., C4 solder balls. The clearance 108 is zero or approaches zero when alternative die external connections 106, e.g., metal pads, are used to connect to substrate (external) connections 160 that are also metal pads, e.g., by hybrid bonding.

In some embodiments, a redistribution layer (RDL) 130 is the top substrate layer. In some embodiments, the RDL 130 is near the top substrate layer, i.e., one or two substrate layers 120 or many substrate layers 120 below the top substrate layer 131.

The RDL 130 is one of the substrate layers 120. The RDL has a plurality of connections, both substrate horizontal connections (in the RDL also referred to as RDL horizontal connections) 137/510 and substrate via connections (in the RDL also referred to as RDL via connections) 525. Typically, the RDL 130 is highly metalized, i.e., there are many RDL horizontal connections 137 (and in some embodiments many RDL via connections 525) with a very high pitch or high density within the RDL 130.

The high density of the RDL horizontal 137/510 and RDL via 525 connections enable interconnection between and among die external connections 106 on one or more of the dies 105 in the die package 100 and also between and among other components 520 and substrate connections (corresponding substrate connections) 160 and external package connections, e.g., 206, discussed below.

One or more of the dies 105 is disposed on the top substrate layer 131. FIG. 1 shows the RDL 130 as the top substrate layer 120/131. However, as stated, it is envisioned that the RDL 130 can be 1 to 3 layers below the top substrate layer 131. Other configurations are possible.

While one die 105 can be disposed on the top substrate layer 131, e.g., 130, the present invention enables a plurality of dies 105 or multiple dies 105 disposed on the top substrate layer 131 and enclosed by the dam enclosure 150.

As the number of dies 105, the number of internal die devices within the internal circuitry of each die (not shown), and the number of die external connections 106 increases, the number/density of RDL interconnections, e.g., 133/135/137/510/525/160, also increases. These interconnections become finer/thinner as the density increases. As such, the RDL, e.g., 130, and other substrate layers, typically 120, become thinner, the RDLs 130/layers 120 have less stiffness, are more fragile, are harder to handle, and are more prone to bending, deforming, distorting, and cracking. As stated, RDLs, e.g., 130, can have an RDL thickness 109 between 1 and 200 microns with RDL connections, typically 137, in the RDL 130 having a pitch between 1 and 50 microns.

The dies 105 have one or more die external connections 106. The die external connections 106 can be any known connection like a C4 solder ball 106 or a solder micro-bump (not shown) 106 or a metallic pad (not shown) 106. One or more of the die external connections 106 is electrically connected 165 to one or more substrate (external) connections, e.g., 160. When a die external connection 106 is electrically connected 165 to a substrate connection 160, the respective substrate connection 160 is called a corresponding connection 165.

These electrical connections 165 to the die external connections 106 can be any known electrical connection. For example, the electrical connections can be a solder reflow of a C4 die external connections 106 or a metal pad to metal pad connection, i.e., a hybrid bond 165. These connections 165 are known.

FIG. 1 shows a RDL horizontal connection 133 connecting a die external connection 106 on two separate dies 105. In most cases, the area other than the pad 133 where the C4 106 is connected is covered with dielectric material.

FIG. 1 also shows a RDL horizontal (external) connection 137 that is electrically insulated by insulator 182 from a die external connection 106 that is in proximity to the respective RDL horizontal connection 137. In this example, the horizontal connection 137 is physically close the respective die external connection 106 but needs to be electrically insulated from the horizontal external connection 137 by the electric design of the package 100. In other locations (not shown), other die external connections 106 may have an electrical connection with the horizontal connection 137.

The insulator 182 can be made of materials including one or more of the following: a dielectric, a polymer, and an undoped semiconductor.

A dam enclosure 150 is made from one or more dam stiffeners, typically 151, formed to make an enclosed volume 158 inside the dam enclosure 150. The dam enclosure surrounds and encloses one or more of the dies 105 that are in the enclosed volume 158.

The dam stiffeners 151 are made from a stiff material or a material that can be formed into a stiff component or structure. The stiff component is meant as a component that is stiff enough so that when the stiff component is physically attached to the substrate 110 and/or top substrate layer 131, the resulting structure 100 can be handled and subjected to mechanical and thermal stress without or with reduced bending, deforming, and distorting, and/or cracking within the targeted design criteria or specification. Furthermore, the use of one or more stiffeners may be attached to the top surface of the substrate and/or layer and/or be embedded in the substrate layer or layers and/or may be attached to the bottom surface of the substrate. The stiffener or stiffeners may aide in warpage control based on their material and structural properties, their coefficient of thermal expansion (CTE) relative to the substrate, chips and other components, lids or heat sinks, design for thickness, width and shape, wiring/metal loading in the substrate layers, balance of or lack of balance in metal loading in the substrate layers relative to the dielectric material and CTE (such as but not limited to metal loading in the build up layers on either side of a core layer(s) in a substrate or alternate type of substrate and hybrid composite of substrate layers and materials. Examples of materials with high stiffness or rigidity are typically materials with a high modulus such as ceramic materials, glass materials, steel with a design thickness and width that may minimize or eliminate substrate warpage due to a single layer or may be used with two or more layers or a design which aides to minimize or reduce substrate bow or warpage based on the stiffener being joined to or adhered to the substrate or embedded in the substrate. The substrate flatness or resistance to become nonplanar during processing or through temperature excursions depends on the substrate size, chips, interconnection specifications and thus may be held to 1 to a few microns or may be able to accommodate higher non-coplanarity of 10's of microns or more. In addition, the design of the stiffener and selection of adhesive need to provide both the targeted flatness of the substrate and components during processing and product use while avoiding adhesive failure, substrate failure and interconnection failure.

In some embodiments, the dam stiffeners 151 are also thermally conductive. In some embodiments, one or more of the dam stiffeners 151 are metallic.

Dam stiffener 151 materials include metals and metal alloys such as copper, nickel, Invar (Fe—Ni alloy) copper with nickel coating, solder, aluminum, stainless steel, graphite, ceramic, glass, silicon or hybrid mixed structures and Thermal Interface Material (TIM). Alternative stiffeners may be comprised a metal or metal alloy with a thin dielectric layer, oxide layer, nitride layer or alternate coating to both provide co-planarity, support heat removal due to thermal conduction while providing a thin electrical insulation layer to avoid electrical current transmission for some applications.

In some embodiments, the dam stiffeners 151 have a stiffener height 153 and a stiffener depth 155 resulting in a stiffener cross sectional area (not shown). In some embodiments, the stiffener height 153 is between 400 μm and 5 mm and the stiffener depth 155 may correspond to a fraction of the substrate thickness or more depending on the substrate X-Y size and thickness and the CTE of the stiffener and corresponding substrate. The dam stiffener 151 cross sectional area in FIG. 1 is shown as rectangular but other shapes are envisioned, as discussed below.

FIG. 1 shows a dam enclosure 150 with dam stiffeners 151 configured to make a rectangular enclosed volume 158. Other enclosed volume 158 shapes and configurations of dam stiffeners 151 are envisioned. For example, a single dam stiffener 151 can be formed to create a circular or oval shaped enclosed volume 158.

In some embodiments, the dam stiffeners 151 are physically attached to the top layer 131 of the substrate 110, e.g., with an electrically non-conductive adhesive. In some embodiments, e.g., where the dam stiffeners 151 are metallic, the dam stiffeners are soldered or otherwise bonded to one or more of the substrate connections, e.g., 135. In still other embodiments, one or more of the dam stiffeners 151 is the same component as one of the substrate connections, e.g., 135, but formed with a cross section area to enable a stiffness, similar to a structural beam, over the length of the substrate connection, e.g., 135. For example, the dam stiffener 151 cross-section area can be of different profile shapes including but not limited to an: I-profile, H-profile, bar-profile, L-profile, box-profile, T-profile, rod-profile, window frame profile, etc.

There are insulated regions, e.g., 164/164A/175/175A, where the dam enclosure 150 is physically connected to the top substrate layer 131 but not electrically connected. For example, while the dam stiffeners 151 (and as a result, the dam enclosures 150) are physically connected to the horizontal connection 137, at insulated regions 164/175, there is no electrical connection due insulating layer 180 separating the dam enclosure 150 and horizontal connection 137 from one another. In some insulated regions 164A/175A, there is no electrical connection because the dam enclosure 150 is in physical contact/connection 164A/175A with an electrical non-conductive part of the substrate 110/131.

To continue the example, the dam enclosure 150 passes over the horizontal connection 137 in the top substrate layer 131 at two physical connections 164 and 175. At both locations 164/175 there is a physical connection between the dam enclosure 150 and the top substrate layer 131, e.g., the RDL 130. This physical connection can be formed with an electrically non-conductive adhesive or other attachment method.

However, the physical connection is electrically insulated 180 between the dam enclosure 150 and the horizontal connection 137 at physical connections 164/175. Therefore, there is no electrical connection at physical connections 164/175 even though the dam enclosure 150 and top substrate layer 131 are close to one another and physically connected.

An insulating layer 180 is placed between the dam enclosure 150 and horizontal connection 137 at the insulated regions 164/175. The insulating layer 180 can be made of non-conductive materials like epoxy, resin, dielectrics, polymers, as mentioned above.

Although there is no electrical connection at the physical connections 164/175, the physical connection at these physical connections 164/175 adds to the total physical connection between the dam enclosure 150 and the top substrate layer 131. This makes the die package 100 stiffer without causing an electrical short circuit between the dam enclosure 150 and the horizontal connection/substrate external connections 137.

In alternative embodiments, there are one or more insulated regions 164A/175A between the dam enclosure 150 and the top substrate layer 131 because the top substrate layer 131 is not electrically conductive in these insulated regions 164A/175A. In these insulated regions 164A/174A, the dam enclosures 150 physically attaches directly to the top substrate layer 131, e.g., with an adhesive.

In some embodiments, the RDL surface 131 is generally covered with an insulating film except for the electrical pads, e.g., 160 and substrate external connections, e.g., 137. In other embodiments there are exceptions where the dam stiffeners 151 are directly connected to the metal regions 135 of the laminate/layer 130 when the dam stiffeners 151 are used for cooling, as described below.

However, there are constraints in electrically connected regions 166 where the dam stiffeners 151 are electrically connected to a horizontal (substrate external) connections, e.g., 135, particularly when the top substrate layer 131 is a RDL 130 and the dam stiffeners 151 are made of conductive material, e.g., metallic dam stiffeners 151.

For example, there is a physical connection and an electrical connection between the dam enclosure 150 and the horizontal connection, e.g., 135 in the top substrate layer 131. In these embodiments, the physical/electrical connection can be made by soldering or other bonding techniques. In other embodiments, the horizontal connection 135 and dam enclosure 150 are one unified element that is both electrically conductive and has a stiffness created by material selection and the design cross section of the combined horizontal connection, e.g., 135, and the dam stiffeners 151 of the dam enclosure 150 at these physical/electrical locations, e.g., 166.

At these physical/electrical connected regions 166, the design of the die package 100 must insure that: i. the dam enclosure 150 does not electrically connect to some of the horizontal, typically 137, or vertical connections 525 not to be connected to horizontal connection 135, e.g., where a short circuit would be created and ii. the connected horizontal connection 135 is at a voltage potential at which the dam enclosure 150 also can be placed.

In some embodiments, the horizontal connection 135 is a ground plane. Therefore, physically and electrically connecting a metal dam enclosure 150 to the horizontal ground plane connection 135, also places the metal dam enclosure 150 at ground potential. Also, in these instances, since the metal dam enclosure 150 is at ground potential, the metal dam enclosure 150 can both provide stiffness to the die package 100 and provide electrical ground connections to horizontal 510 and vertical connections 525 in the top substrate layer 131, where appropriate.

In other words, in some embodiments of the die package 100, there are one or more metallic dam stiffeners 151 that form a metallic dam enclosure 150 that physically connects to the top layer 131 of the die package 100 and that electrically connects to one or more horizontal, substrate external connections, typically 135, in the top substrate layer 131 at electrically connected regions 166. Therefore, in some embodiments, the metallic dam enclosure 150 has electrically connected regions 166 and electrically unconnected or insulated regions 164/175/175A.

In alternative embodiments, the dam stiffeners 151 and dam enclosure 150 are made of electrically non-conductive material. In these embodiments, electrical insulation of the horizontal connections 137 and/or direct electrical connections at appropriate electric potential 135, e.g., ground planes 135, may not be necessary.

The design and placement of the dam stiffeners 151 or the dam enclosure 150 helps provide stiffness to the die package and holds the package flat during die package 100 assembly and operation. The amount of warpage of the die package 100 is less than 60 μm to 500 μm. As an example, the allowable warpage value is determined by the height/amount of solder used between the substrate 880 (see FIG. 8) and the die package 100 to be mounted. This permits easier handling of the die package 100, positioning the dies 105 and other components 520 more accurately on the top substrate layer 131 and enables better electrical connection of the dies 105 and other components 520.

As described in more detail below, in addition to providing more stiffness and heat conduction/dissipation, the dam enclosure 150 acts as a mold which enables deposition of one or more underfill layers which provide the die package 100 with additional rigidity, flatness, stiffness, and strength to reduce mechanical and thermal stresses.

Figure 2:
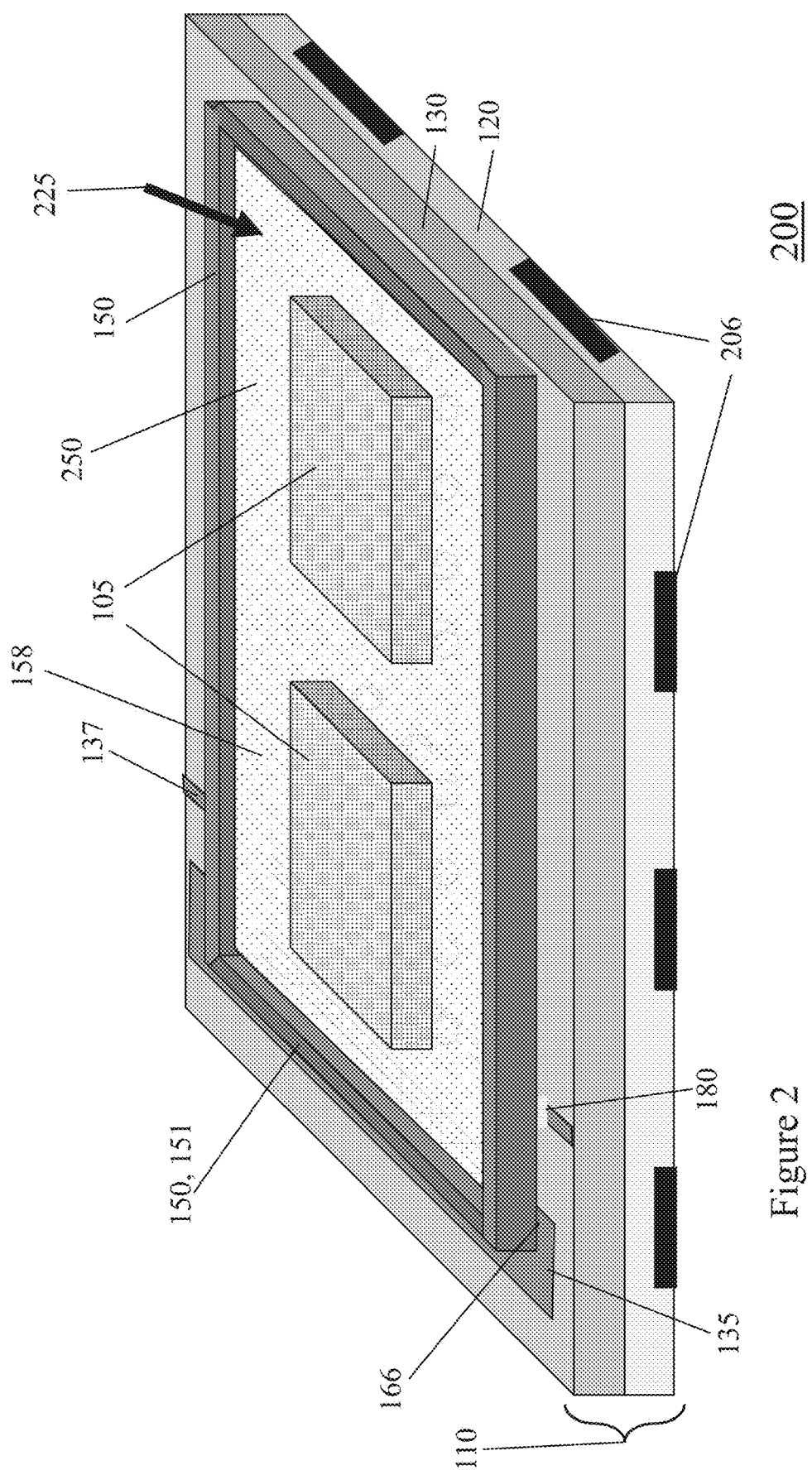
FIG. 2 is an isometric illustration of a multiple die assembly in a die package with a metallic dam enclosure that is physically connected to a top substrate layer and covered by a low viscosity underfill contained by the metallic dam enclosure.

FIG. 2 is an isometric illustration of a multiple die assembly die package 200 with a metallic dam enclosure 150 made of stiffeners 151. The metallic dam enclosure 150 physically connects to the top substrate layer 131 and contains a low viscosity underfill 250 that covers the top substrate layer 131.

The metallic dam enclosure 150 is physically connected to the top substrate layer 131, e.g., a RDL 130, and is (optionally) electrically connected to one or more horizontal 135 connections in the top substrate layer 131 at electrically connected regions 166. Also, the metallic dam enclosure 150 is electrically insulated 180 from one or more horizontal connections 137/510 and vertical 515 connections in the top substrate layer 131 at one or more electrically insulated regions 164/164A/175/175A of the dam enclosure 150. See FIG. 1 for the locations of the electrically connected region 166 and the electrically insulated regions 164/164A/175/175A/180. In some embodiments, these regions are covered by a low viscosity underfill 250 shown in FIG. 2.

A low viscosity underfill 250 is deposited 225 in the enclosed volume 158 enclosed by the dam enclosure 150. Therefore, the low viscosity underfill 250 is contained by the dam enclosure 150 and surrounds the dies 105. In some embodiments, the low viscosity underfill 250 fills the small clearance 108 between a bottom surface 105B of the dies 105 and the top substrate layer 131, e.g., when the die external connections 106 are C4 solder balls 106.

In some embodiments, the fill level of the low viscosity underfill 250 is high enough to completely fill the clearance 108 but not high enough to cover the dies 105. Note that one or more of the dies 105 can be a die stack. Typically, the low viscosity underfill 250 covers between the bottom $\frac{1}{3}^{rd}$ and bottom $\frac{2}{3}^{rd}$ of the height of the dies 105 or just enough of the dies 105 so the dies remain immobile after the low viscosity underfill 250 cures. As an example, the low-viscosity UF only needs to fill the area between the chip and the top of the RDL layer, so a fillet is only formed on the outside of the chip, and the low-viscosity UF does not necessarily reach the place where the stiffener is located.

Typically, the low viscosity underfill 250 has a viscosity between 2 and 40 pascal-second (Pa-s) at 25 degree C. In some embodiments, the low viscosity underfill 250 has particles with a small particle size. (The maximum filler size is less than 10 um.) This enables the low viscosity underfill to penetrate and fill the clearance 108 while applying very low pressure/force on the dies 105, substrate 110, and/or substrate layers 120/130.

In some embodiments, the filler size of the low viscosity underfill 250 is small enough and well controlled so that the viscosity of the low viscosity underfill 250 can be dispensed at a low dispensing temperature. In some embodiments, the low viscosity underfill 250 naturally fills the gap/clearance 108 between the chip bottom 105B and the substrate top 131 by capillary action and without the need to apply pressure. For example, using these low viscosity underfills 250, gaps/clearance 108 as small as 20 μm can be filled without applying pressure.

After curing, the low viscosity underfill 250 provides added stiffness to the die package 200 and maintains the position and alignment of the dies 105 and any other components on the top substrate layer 131. This is enabled because the low viscosity and small particle size of the low viscosity underfill 250 enables deposition of this underfill 250 with minimal force/pressure.

Figure 3:
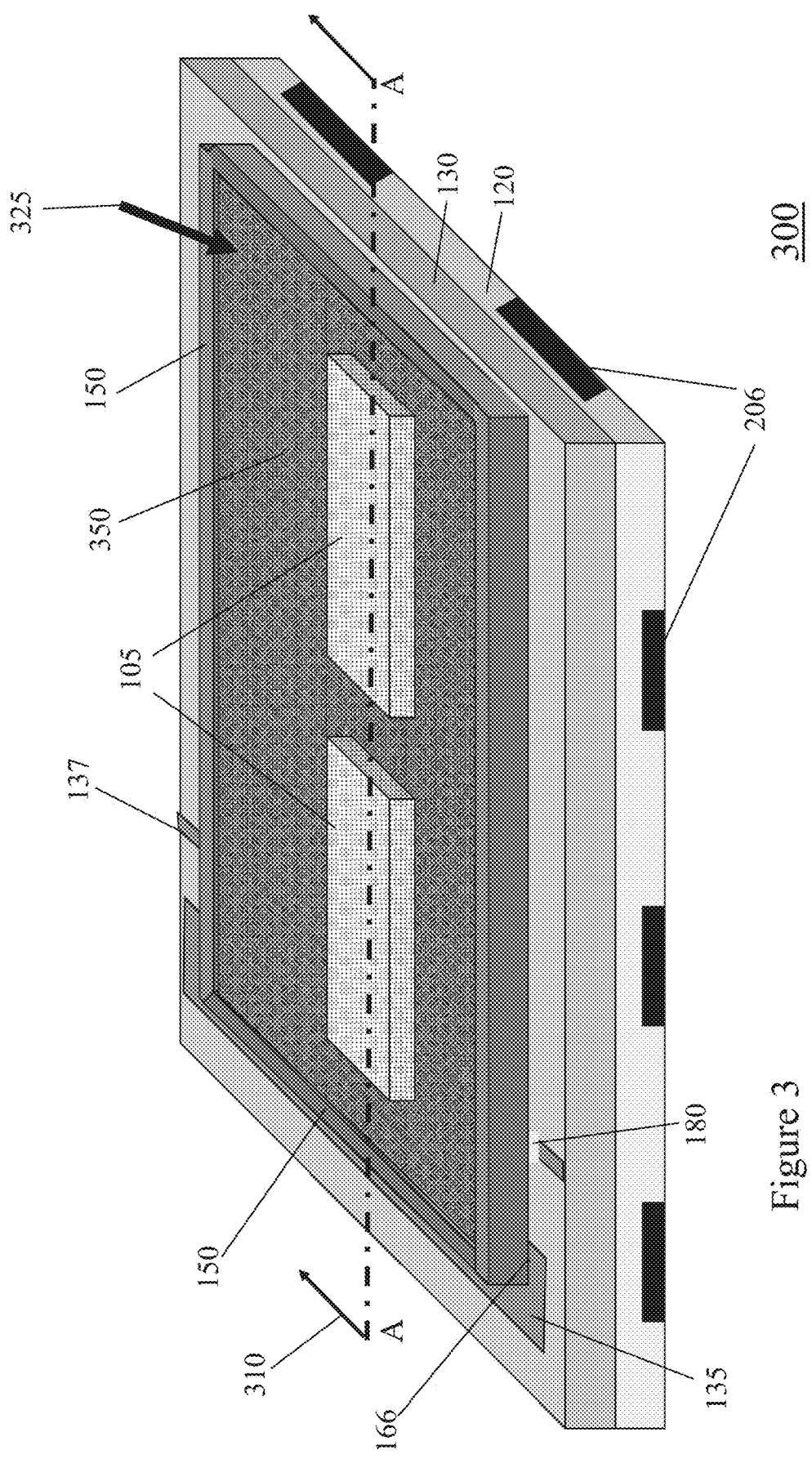
FIG. 3 is an isometric illustration of a multiple die assembly in a die package with a metallic dam enclosure made of stiffeners containing a high viscosity underfill disposed on a low viscosity underfill.
Figure 4:
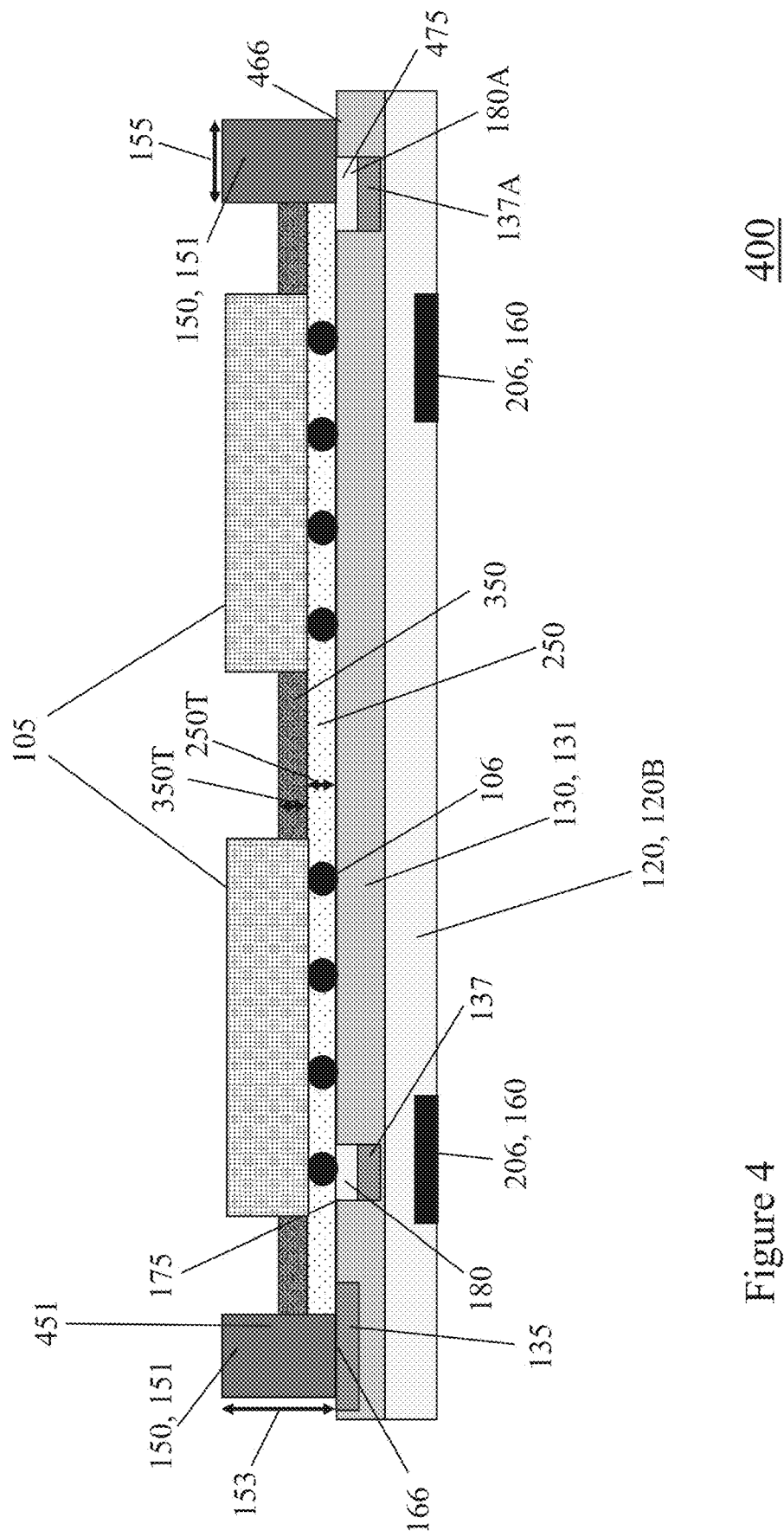
FIG. 4 is an elevation cross section view of one embodiment of a multiple die assembly in a die package made of one or more metallic dam stiffeners that form a metallic dam enclosure that is physically connected to a top substrate layer, e.g., a RDL.

FIG. 3 is an isometric illustration of a multiple die assembly in a die package 300 with a metallic dam enclosure 150 made of stiffeners 151 with a high viscosity underfill 350 disposed on the low viscosity underfill 250 described above. A cross section view A-A 310 is shown in FIG. 4.

The high viscosity underfill 350 has a viscosity higher than 40 Pa-s and has particles that are larger than those particles in the low viscosity underfill 250. In some embodiments, the maximum filler size is higher than 10 um.

The high viscosity underfill 350 is contained by the dam enclosure 150 and surrounds the dies 105. In some embodiments, the high viscosity underfill 350 covers the dies 105.

Since the high viscosity underfill 350 has a high viscosity (and larger particle sizes), the application 325 of the high viscosity underfill 350 generally requires more pressure/force to apply than the pressure/force to apply the low viscosity underfill 250. However, since the high viscosity underfill 350 is not filling tight clearances, the underfill 350 application 325 pressure/force can be reduced. In addition, the structure 300 can withstand larger application forces of the high viscosity underfill 325 because the cured low viscosity underfill 250 maintains the dies 105 and other components in position without shifting and also maintains the stiffness, flatness, rigidity, and strength of the die package 300. In some embodiments, the high viscosity underfill 350 spreads naturally as it drips and spreads between the dam stiffeners 151 and the chips 105. In some embodiments, the high viscosity underfill 350 resides within the dam enclosure 150 and surrounding the dies 105.

The combined stiffness provided by the dam stiffeners 151/dam enclosure 150, the low viscosity underfill 250, and the high viscosity underfill 350 give the die package 300 enough stiffness and stability to remain flat and resist stresses in the later stages of manufacturing and assembly (e.g., transporting, dicing, positioning, and attaching to laminated substrates). These benefits persist even to large area, wafer level circuitry, e.g., with substrates made on wafers at 300-millimeter scale and at larger sizes for substrates on panels. Use of wafer and panel processing using temporary handle wafers and panels can complement the build and integration of integrated modules with stiffeners, hybrid substrates and/or lidded modules. Further, complementing the package build and integration for warpage minimization/coplanarity management can be made with selection of a handle with CTE, modulus and thickness/structure that best support coplanarity control during processing and through thermal temperature excursions.

FIG. 4 is an elevation cross section view (at section A-A 310) of one embodiment of a multiple die assembly in a die package 400 made of one or more metallic dam stiffeners 151 that form a metallic dam enclosure 150 physically connected to the top substrate layer 131, e.g., a RDL 130.

The metallic dam enclosure 150 is electrically connected to one or more horizontal 135 or vertical (typically 525, below) connections in the top substrate layer 131, e.g., 130, at electrically connected regions 166. The metallic dam enclosure 150 is electrically insulated (but still physically connected) to/from other horizontal and vertical connections and other regions in the top substrate layer 131, e.g., 130, at one or more electrically insulated regions 164/164A/175/175A/466/475 of the dam enclosure 150. For example, at electrically insulated regions 175 and 475, the horizontal connections 137 and 137A are electrically insulated from metallic dam enclosure 150 by electrical insulators 180 and 180A, respectively. (Note that part of the electrically insulated region 175 can be located "forward and out" of the FIG. 4 and therefore is not seen in this elevation cross section view. Note also that an example rectangular cross section 451 of the metallic dam enclosure 150 is shown.) As mentioned, connections that are both electrical and physical, e.g., electrical connections to 106, like solder connections to C4's 106, also add stiffness and strength to the structure 400.

The high viscosity underfill layer 350 is disposed on the low viscosity underfill layer 250. In this embodiment, both underfill layers 250/350 are contained by the metallic dam enclosure 150. The high viscosity underfill layer 350 and the low viscosity underfill layer 250 surround one or more (multiple) dies 105 in the die package 400. The low viscosity underfill layer 250 has a low viscosity underfill layer thickness 250T between 5 um and 100 um. (Since the primary purpose is to fill the gap/clearance 108 between the chip 105 and the RDL layer 130, it depends on the bump height.) In some embodiments, the high viscosity underfill layer 350 has a high viscosity underfill layer thickness 350T between 10 um and 4 mm. (The high viscosity underfill layer thickness 350T should be lower than stiffener height 153.)

In this non-limiting illustration 400, the thicknesses 250T/350T of the low viscosity underfill layer 250 and the high viscosity underfill layer 350 are reduced to show the dies 105. The layer thicknesses 250T/350T are not shown in scale in the FIG. 4.

One of the substrate layers 120, e.g., a bottom substrate layer 120B, has one or more substrate external connections 206. These substrate external connections 206 are also package external connections 160/206 in instances where the bottom substrate layer 120B is also the bottom layer of the package 400. The substrate external connections 206 can be any known connection type including C4 solder ball or BGA solder ball or metallic pads 206.

Figure 5:
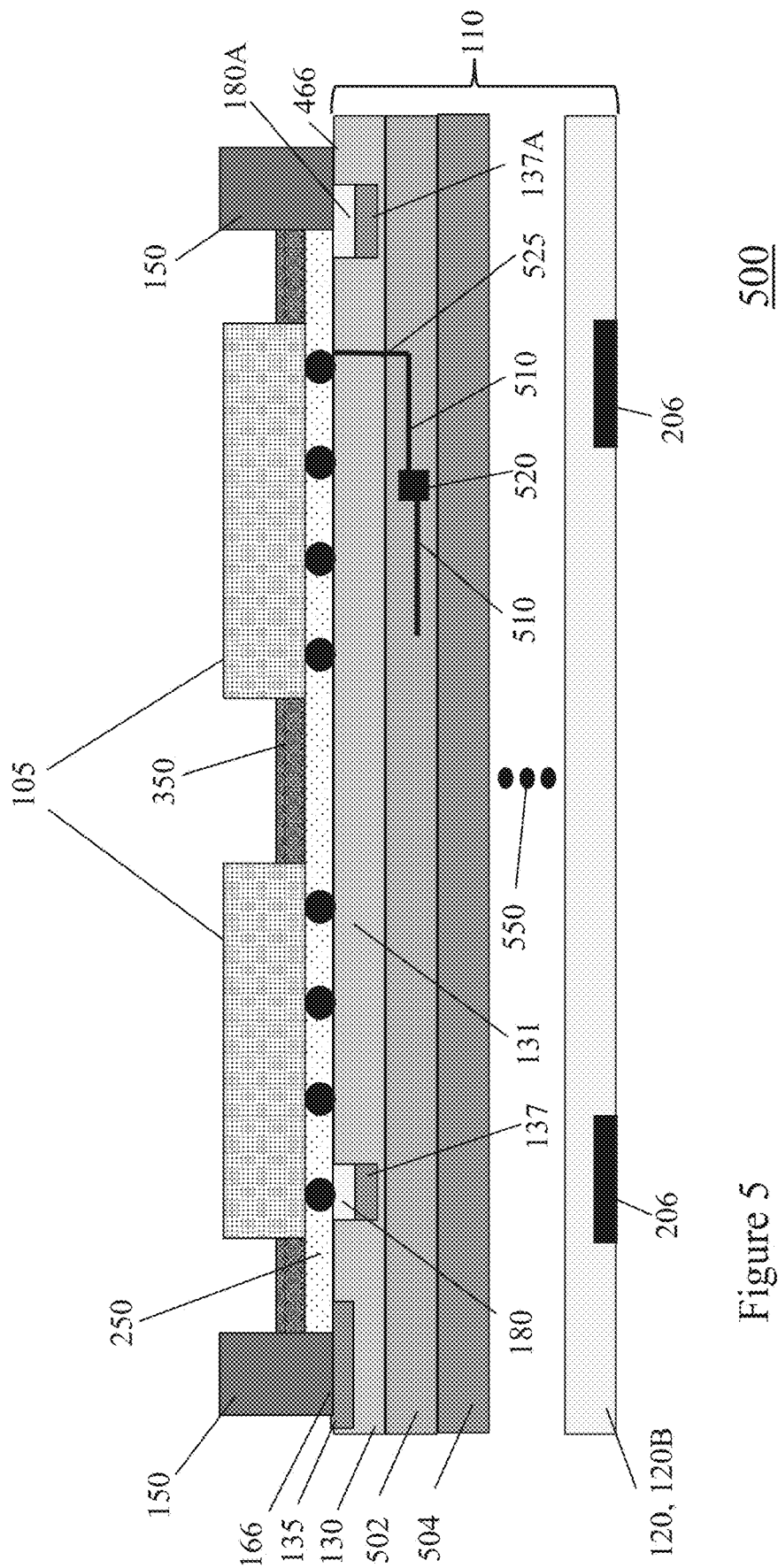
FIG. 5 is an elevation cross section view of one embodiment of a multiple die assembly in a die package with a metallic dam enclosure that is physically/mechanically connected to the top substrate layer, e.g., a RDL, and that has multiple substrate layers.

FIG. 5 is an elevation cross section view of one embodiment of a multiple die assembly in a die package 500 with a metallic dam enclosure 150 that is physically/mechanically connected to the top substrate layer 131, e.g., a RDL 130. Here the substrate 110 has multiple substrate layers, 120/120B/130/502/504, typically 120.

FIG. 5 is an elevation cross section view of one embodiment of a multiple die assembly in a die package 500 with a metallic dam enclosure 150 that is physically/mechanically connected to the top substrate layer 131, e.g., a RDL 130. In this embodiment, the metallic dam enclosure 150 is electrically connected to one or more horizontal connections 135, e.g., a ground plane 135, at electrically connected regions 166. The metallic dam enclosure 150 is electrically insulated from horizontal 137/510 and vertical 525 connections in the top substrate layer 131, e.g., 130, at one or more electrically insulated regions 466/180.

The die package 500 also shows alternative embodiments where there are one or more substrate layers 120 between the bottom substrate layer 120B and the top substrate layer 131. Examples of these substrate layers, typically 120, include substrate layers 502 and 504. Some of these substrate layers 120/502/504 are under the RDL 130. In some embodiments, the RDL 130 is the top substrate layer 131. In some embodiments, the RDL 130 is below one or more of the substrate layers 120. In some embodiments, the RDL 130 is a combination of one or more of these layers, including the substrate layers 120/502/504.

Also shown are horizontal substrate connections 510, vertical substrate connections 525, and components 520 that reside inside one or more of the substrate layers 120/502/504. Components 520 include known active and passive components 520 such as transistors, resistors, capacitors, etc. Horizontal substrate connections (or substrate internal horizontal connections) 510 are conductive, e.g., metallic connectors, that run within the substrate layers, typically 120. Vertical substrate connections 525, e.g., vias 525, are conductive/metallic connectors that run orthogonal to the horizontal substrate connections 510 and substrate layers 120 and make connections between the substrate layers 120.

Horizontal substrate connections 510, vertical substrate connections 525, and components 520 within substrate layers 120 are known.

Figure 6:
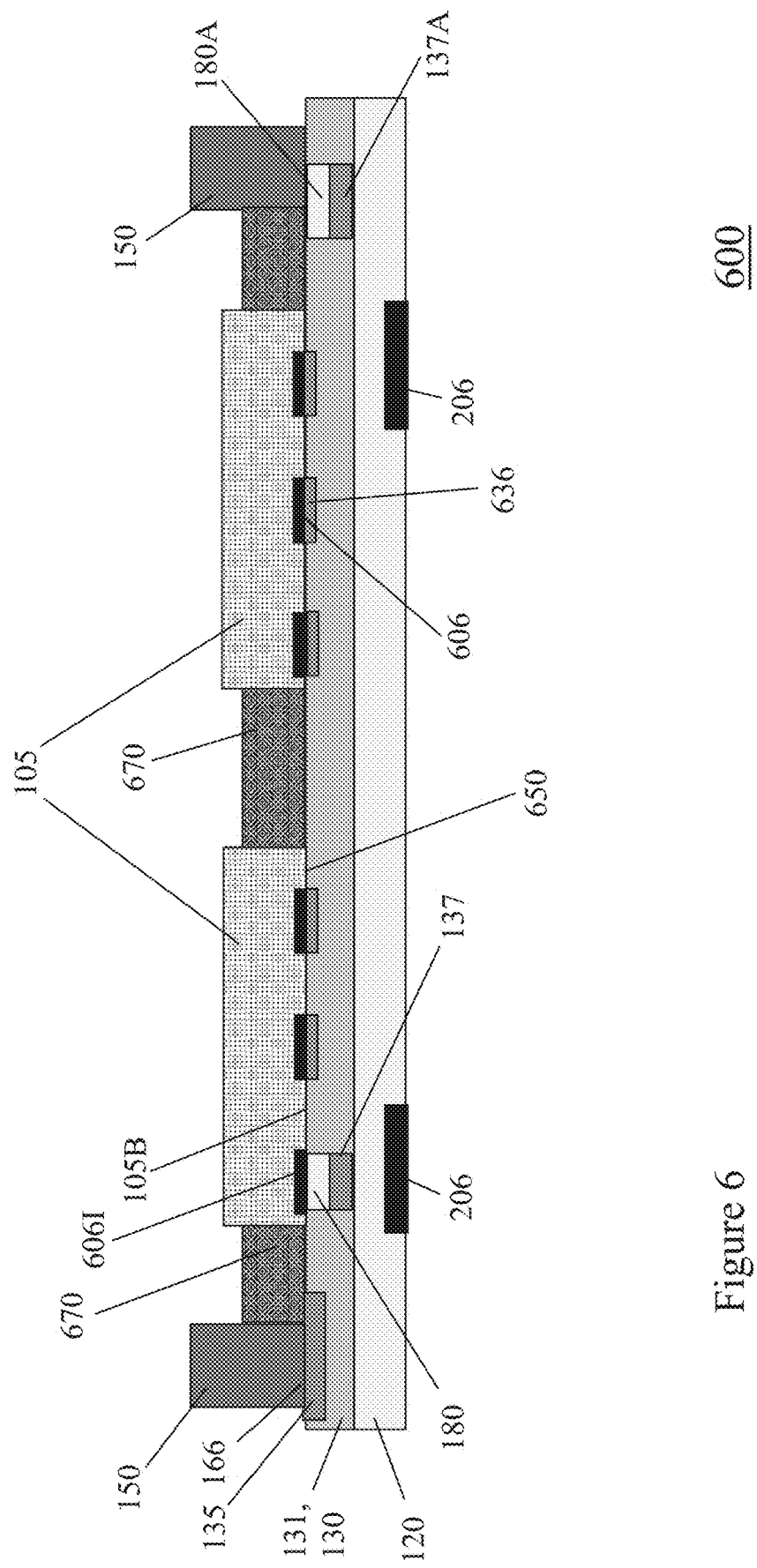
FIG. 6 is an elevation cross section view of one alternative embodiment of a die package with a metallic dam enclosure where there is little or no clearance between the die bottoms and the substrate top layer.

FIG. 6 is an elevation cross section view of one alternative embodiment of a die package 600 with a metallic dam enclosure 150 where there is little or no clearance 650 between the die bottoms 105B and the substrate top layer 131.

As before, in this embodiment, the metallic dam enclosure 150 is physically/mechanically connected to the top substrate layer 131, e.g., a RDL 130, while the metallic dam enclosure 150 is electrically connected to one or more horizontal connections 135, e.g., a ground plane 135, at electrically connected regions 166, and while the metallic dam enclosure 150 is electrically insulated 180 from horizontal 137/510 and vertical connections 525 in the top substrate layer 131, e.g., 130, at one or more electrically insulated regions 180/180A/466, etc.

In this embodiment 600, the die external connections 606 are pad connections 606 that are hybrid bonded to the substrate connections 636 which are also pad connections 636. As a result, there is zero or near zero clearance 650 between the die bottom 105B and the top substrate layer 131/130. In addition, the dies 105 are held in position once the hybrid bonds are formed.

For these reasons, there is no low viscosity underfill layer 250 used in this embodiment 600. Since there is no or little clearance 650, the underfill would not penetrate between the die bottom 105B and the top substrate layer 131/130. Therefore, a single underfill layer 670 is contained by the metallic dam enclosure 150 and surrounds the dies 150.

In some embodiments, the single underfill layer 670 is made of a high viscosity material, the same as the high viscosity underfill 350 described above.

Figure 7:
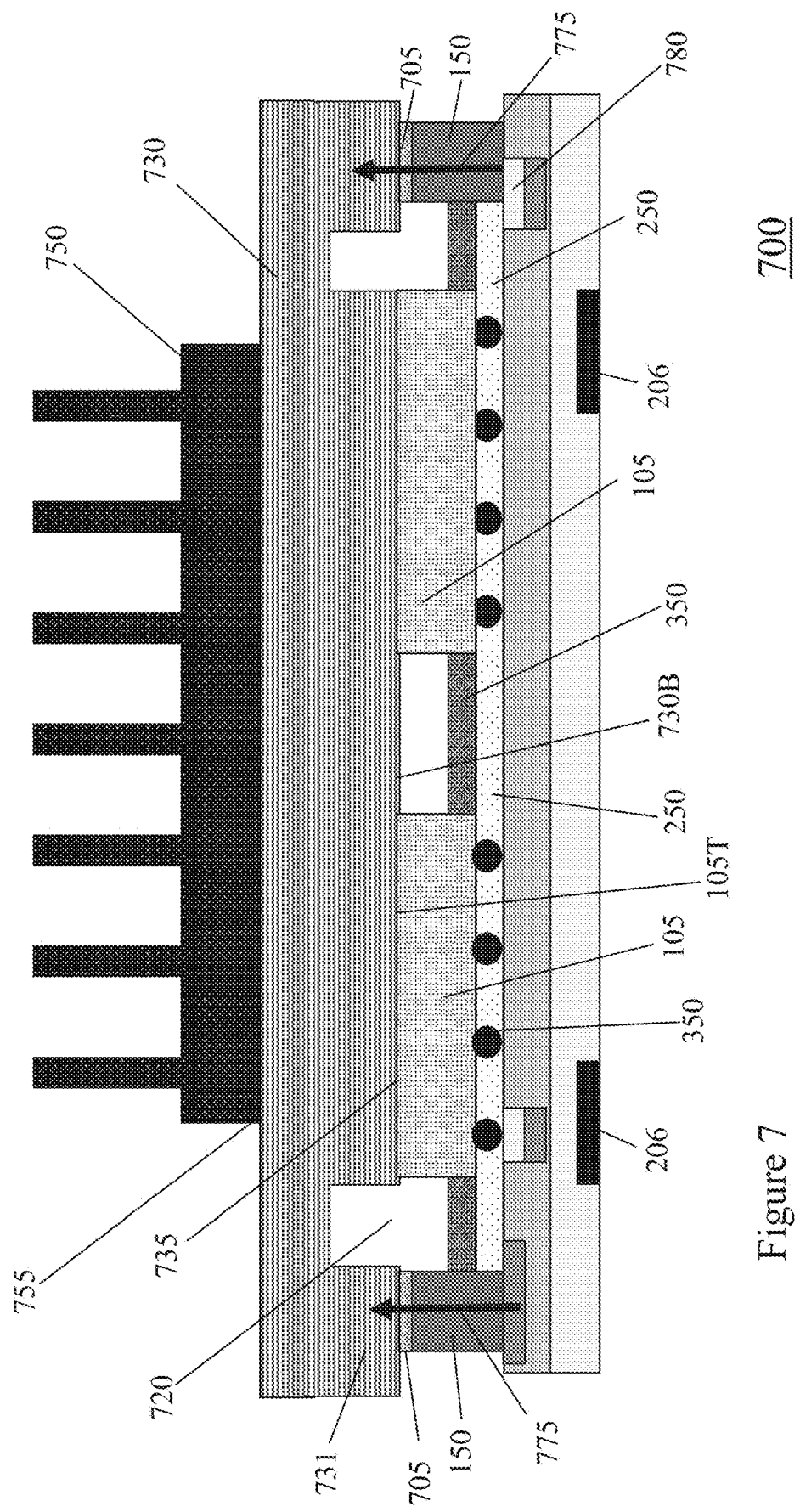
FIG. 7 is an elevation cross section view of multiple die assembly die package embodiment where the metallic dam stiffener also serves as a heat conduction path through a heat spreader and heat sink.

FIG. 7 is an elevation cross section view of multiple die assembly die package embodiment 700 where the metallic dam enclosure 150 also serves as a heat conduction path 775 through a heat spreader 730 and heat sink 750.

FIG. 7 is an elevation cross section view of multiple die assembly die package embodiment 700 where the metallic dam enclosure 150 also serves as a heat conduction path(s) 775 directing heat away from the dies 105 and substrate layers, typically 120, through heat dispersion components like the heat spreader 730 and heat sink 750.

In some embodiments, the heat spreader 730 has a heat spreader bottom surface 730B that is in physical contact with the die top surface 105T of one or more of the dies 105 and the metallic dam enclosure 150. Generally, these physical contacts include a Thermal Interface Material (TIM) 705 placed between the two contacting surfaces. For example, there would be TIM (not shown) between the die top surface 105T and the heat spreader bottom surface 730B at physical and thermal contact 735. There would also be a TIM 705 between the metallic dam enclosure 150 and the heat spreader bottom surface 730B, e.g., under the heat spreader legs 731. Heat conduction paths 775 are created through these thermal contacts 705/735. Heat flows through these heat conduction paths 775 away from the dies 105 and other substrate layers, e.g., 120, through the heat spreader 730 and ultimately through the heat sink 750.

In some embodiments, the heat spreader 730 creates a heat spreader volume 720 that is an enclosed space 720, enclosed by the heat spreader bottom surface 730B and the metallic dam enclosure 150.

Figure 8:
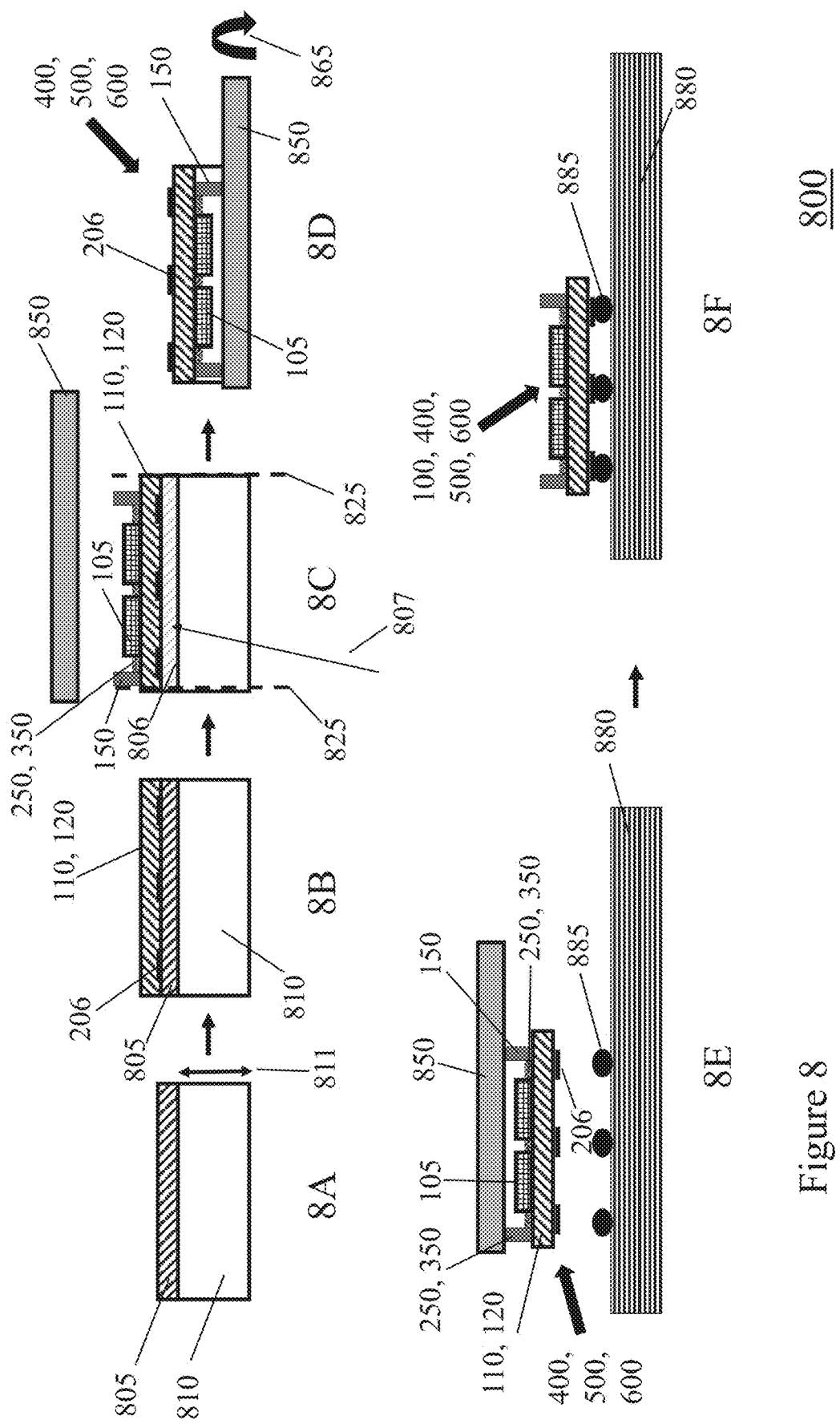
FIG. 8 is a process flow showing structures at steps of making a die package.

FIG. 8 is a process flow 800 showing structures at steps of making a multiple die assembly die package, e.g., 300/400/500/600/700.

In step 8A, a release layer 805 is deposited on an initial substrate 810.

The initial substrate 810 is made of a material like silicon or glass that is flat with a thickness thick enough so there will be no distortion or bending during the steps of the process flow 800. In some embodiments, the initial substrate thickness 811 is between 725 and 775 microns. Other thicknesses are envisioned, as described below.

In some embodiments, the initial substrate 810 is a large surface area, e.g., a wafer level surface area of above 300 mm diameter. Use of these large surface areas is enabled by the structures and methods disclosed in this disclosure.

The release layer (laser ablation layer) 805 is made of a material on which components and other circuitry of the die package 300/400/500/600/700 can be built. The release layer 805 ensures that the components and other circuitry are maintained in position on the initial substrate 810. However, the release layer 805 material is removable so that later in the process flow 800 the die package build can be removed from the initial substrate 810.

In some embodiments, the release layer 805 is made of an adhesive that can be dissolved by a solvent that has no effect on the components and circuitry built upon the release layer 805. In other embodiments, the release layer 805 is made of a material that a laser with a specific frequency range can ablate. In some embodiments, the initial substrate 810 is made of a material that is transparent to a laser 807 at a given energy level. The laser release material is applied or deposited onto the handlers by some standard method e.g., spin coating followed by baking. The laser release layer has an excellent adhesion to both glass/silicon and to any of a number of adhesive materials or dielectric materials with which it will be formed above the release material 805, it must have thermal stability which matches or exceeds that of adhesive or dielectric material with which it is used, and it must be sensitive to a wavelength of the laser (or solvent) chosen for the debonding operation, (e.g., 355 nm). As an example, some materials have thermal stabilities well in excess of 300 C. Once spin-applied and cured, an approximately 250 nm thick cured film is sufficient to absorb about 85% of impinging 355 nm laser ablation 807, ablating cleanly at a fluence threshold on the order of approximately 100 mJ/cm2.

In step 8B, the external package connections 206 are deposited on the release layer 805. In some embodiments, the external package connections 206 are metallic, e.g., copper, pads.

In addition, in step 8B, the package substrate 110 including the substrate layers 120 (including layers 130, 502, 504) are formed above the release layer 805. In this step 8B, the horizontal substrate connections 510, vertical substrate connections 525, and components 520 within substrate layers 120 are formed. The insulating layers 180 are also formed in this step, as is the RDL 130. Therefore, the electrically connected regions 166 and the electrically insulated regions 175/180/466 etc. are located and created in this step 8B.

Note that die package features like the substrate 110 layers 120/130/502/504, components 520, horizontal substrate connections 510, vertical substrate connections 525, and insulating layers 180 are formed on the initial substrate 810. The initial substrate 810 provides a stiff, flat, and undistorted surface on which these layers/components/connections can be formed, assembled, aligned, placed connected, etc. Accordingly, the initial substrate 810 enables accurate and supported placement, formation, and connection for these die package features, even for die package features that are thin, fragile, deformable, and subject to mechanical and thermal stresses.

In step 8C, the dies 105 are placed and electrically connected and the metallic dam enclosure 150 is formed. The metallic dam enclosure 150 is formed and attached to the top substrate layer 131/130 as described above, e.g., by adhesives, soldering, TIM material, etc.

In step 8C, while the die package features are still attached to flat, stiff initial substrate 810, the underfill 250/350 (both the low viscosity underfill 250 and/or the high viscosity underfill 350, depending on the embodiment) is/are deposited and cured. The underfill deposition adds additional strength and stiffness to the structure in step 8C. The structure now can experience the mechanical and/or thermal stresses of the later process steps because the die package features are maintained on the flat, stiff, rigid initial substrate 810 while the metallic dam enclosure 150 is attached and the underfill 250/350 is deposited and cured. For the underfill 250, pre-applied underfill could be used instead of capillary underfill. In this case, the underfill material is applied to the surface of the RDL layer prior to chip bonding. In that case, non-conductive paste (NCP) underfill or non-conductive film (NCF) can be used. Furthermore, in the case of NCF, a method of forming vias on the film where the chip bumps (and stiffener) are located could be used to prevent filler bites between the bumps and pads.

Since in step C each of the structures, e.g., die packages 400/500/600, are flat, rigid, and strong, the die packages can be diced 825 on the larger wafer 810 or initial substrate 810, e.g., by a dicing laser, saw, or other known methods 825. Note that the structures and methods disclosed enable production of large number of die packages 400/500/600 on initial substrates 810 with large surface areas, e.g., silicon or glass initial substrates 810 with greater than 300 millimeter (mm) diameters. Enabling the assembly/manufacturing of die packages 400/500/600 on large initial substrates 810 while maintaining the strength, flatness, and stiffness of these die packages 400/500/600, results in assembly and manufacturing cost reduction (per die package) and higher quality control.

In some embodiments, before attaching a handler 850, a dicing machine is used to make cuts in layers 110 and 120 from the front side of the figure. At this point, we can cut to 810 or not cut wafer 810. Then, for example, the tape/handler 850 is applied to the front side (the side with the dies 150), the entire structure is flipped, and the laser ablation process 807 is performed (solvent applied), so that the release layer 805 reacts with the laser (solvent) and the die package build 400/500/600 is peeled off the handling substrate (810). If necessary, the residue, produced during the laser ablation (solvent) process, is cleaned. This process makes it possible to prepare die packages 400/500/600 in bulk instead of preparing them individually.

In some embodiments, a handler 850 is attached to the metallic dam enclosure 150 side of the die packages 400/500/600. Since the die packages 400/500/600 are flat, strong, and stiff after the dam enclosure 150 is attached and the underfill 250/350 is deposited and cured, a flexible tape is used as a handler 850 in some embodiments. A ridged handler 850, e.g., one made of glass or silicon, can also be used.

The handler 850 can transport and position the one or more of the die packages 400/500/600 in the later steps of the process. In some embodiments, the handler 850 can orient or "flip" 865 one or more of the die packages 400/500/600 as well.

In step 8C, the release layer 805 is removed 806 to detach one or more of the diced die packages 400/500/600 from the initial substrate 810. This also enables the die packages 400/500/600 to be individually and separately handled by the handler 850.

The release layer 805 is removed 806 by processes determined by the release layer 805 material. For example, an adhesive release layer 805 can be removed 806 by a solvent. Some release layers 805 are ablated 806 by the ablation laser 807. In some embodiments, the ablation laser 807 has an energy level which ablates the material in the release layer 805. In some embodiments, the initial substrate 810 is made of a material that is transparent to the ablation laser 807 frequency so that the ablation laser 807 can pass through the initial substrate 810.

In step 8D, the die packages 400/500/600 are diced, separated from the initial substrate 810, attached to the handler/tape 850, and optionally rotated or flipped 865. The handler/tape 850 transports, orients, and/or positions the die packages 400/500/600 to the next location in step 8E.

In step 8E, in some embodiments, the die packages 400/500/600 are individual transported and positioned over a laminate substrate 880. Note that without loss of generality, the laminate substrates can be position over the die packages 400/500/600 as well. Other transporting, positioning, and relative placement of the die packages 400/500/600 and laminate substrate(s) 880 are envisioned. For example, if the packages 400/500/600 are stiffened enough, the handler/tape 850 can be optional.

In some embodiments, the die packages 400/500/600 have external package connections 206 that are metallic (e.g., copper) pads and the laminate or PCB substrate(s) 880 have C4 solder ball or BGA solder ball connections 885. Other connections are envisioned. In some embodiments, external package connections 206 have a pitch between 100 and 500 microns.

In step 8F, the die packages 400/500/600 are physically placed on and electrically connected to the laminate or PCB substrate 880, e.g., by known soldering/reflow methods.

Note that other methods of attachment are contemplated. Also, other substrates 880 are envisioned, e.g., silicon substrates, glass substrates, ceramic substrates, bridges, etc.

Figure 9:
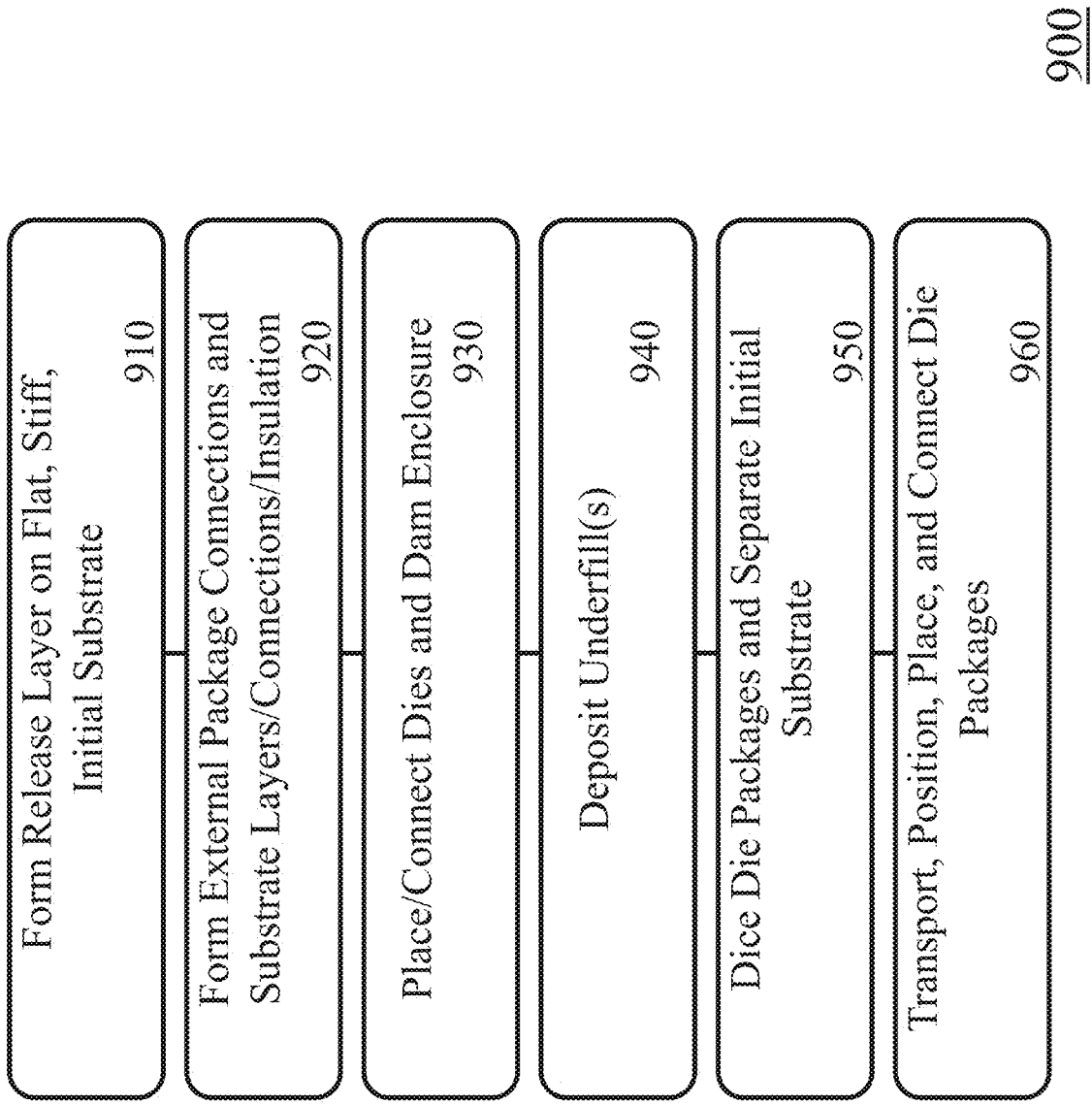
FIG. 9 is a flow chart of a process of making a die package.

FIG. 9 is a flow chart of a process 900 of making a multiple die assembly die package, e.g., 400/500/600.

The process 900 begins with step 910 where a release layer is deposed or formed on a flat and stiff initial substrate 810. In some embodiments, the flat and stiff initial substrate 810 is a semiconductor or glass material. In some embodiments, the thickness 811 of the initial substrate 810 is between 200 um and 4 mm. In some embodiments, the initial substrate has a large surface area with dimensions, e.g., a radius, in excess of 300 millimeters (mm). In some embodiments, the stiff initial substrate is a large area silicon wafer.

The release layer 805, as described above is made of a release layer material that enables structures that are built on the release layer 805 later to be separated from the initial substrate 810, e.g., by chemical solvents or laser ablation 807.

In step 920, one or more external package connections 206 are formed on the release layer 805 using known techniques. In some embodiments, the external package connections 206 are conductive metallic (e.g., copper) pads.

Also in step 920, a substrate 110 is formed on the release layer 805. As described above, the substrate 110 has one or more substrate layers 120/130/502/504. One or more of the substrate layers 120/130/502/504 has one or more substrate connections 135/137/510/525. The substrate connections 135/137/510/525 are either a substrate horizontal connection, e.g., 135/137, or a substrate via connections 25. There is a top substrate layer 131 in the substrate 110.

In step 930, one or more dies 105 are connected 133 on the top substrate layer 131.

Also in step 930, a dam enclosure 150 is attached to the top substrate layer 131, as described above. The dam enclosure 150, encloses 158 the dies 105 within the dam enclosure 150.

In step 940, one or more underfills 250/350 are deposited within the dam enclosure 150. The underfills 250/350 surround the dies 105. A low viscosity underfill 250 is deposited first. The low viscosity underfill 250 fills the clearance 108 between a bottom surface 105B of the dies 105 and the top substrate layer 131. A higher viscosity underfill 350 is deposited on the low viscosity underfill 250. In some embodiments, where the clearance is very small or there is no clearance 108 (e.g., where there is pad to pad hybrid bonding), the low viscosity underfill is not used. For example, in the case of pre-applied underfill such as NCF, it can be applied before chip bonding or stiffener attachment.

In step 950, the die packages 400/500/600 are diced on the initial substrate 810. In some embodiments, the die packages 400/500/600 are diced in such a way that each die package 400/500/600 includes one or more of the dam enclosures 150 and the dies 105 enclosed within the respective dam enclosure 150. In some embodiment, then after attaching the handler from the surface, it is flipped and laser ablated from the back side of 810 to peel off 810.

In step 960, the die packages 400/500/600 are picked, transported, positioned, and placed. As described above, in some embodiments, the die packages 400/500/600 are placed on another substrate, e.g., laminate substrate 880. The die is electrically and physically connected to the laminate substrate 880. For example, die external connections 106, e.g., metal pads, are connected to C4 solder ball or BGA solder ball connections 885 on the laminate or PCB substrate 880 by known methods.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. For example, the semiconductor devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, etc. Systems and hardware incorporating the semiconductor devices are contemplated embodiments of the invention.

The terminology used herein was chosen to explain the principles of the embodiments and the practical application or technical improvement over technologies found in the marketplace or to otherwise enable others of ordinary skill in the art to understand the embodiments disclosed herein. Devices, components, elements, features, apparatus, systems, structures, techniques, and methods described with different terminology that perform substantially the same function, work in the substantial the same way, have substantially the same use, and/or perform the similar steps are contemplated as embodiments of this invention.

We claim:

1. A semiconductor die (die) package comprising;
a substrate having one or more substrate layers, one or more of the substrate layers having one or more substrate connections, the substrate connections being one of a substrate horizontal connection and a substrate via connections, the substrate having a top substrate layer and a bottom substrate layer;
one or more redistribution layers (RDLs), the RDLs being one of the substrate layers, the RDLs having one or more RDL connections, the RDL connections being one of a RDL horizontal connection being one of the substrate horizontal connections and a RDL via connections being of the substrate via connections;
one or more dies disposed on the top substrate layer, each of the dies having one or more die external connections, one or more of the die external connections being electrically connected to one or more of the substrate connections, being corresponding substrate connections; and
one or more metallic dam stiffeners, the metallic dam stiffeners connected to form a metallic dam enclosure, the metallic dam enclosure disposed on and physically attached to the top substrate layer, the metallic dam enclosure enclosing one or more of the dies, the metallic dam enclosure having one or more electrically connected regions where the metallic dam enclosure is electrically and physically connected to one or more of the substrate horizontal connections and one or more electrically insulated regions where the metallic dam enclosure is electrically insulated from but physically connected to one or more of the substrate horizontal connections and the substrate via connections.

2. The die package, as in claim 1, where one or more of the electrically connected regions is where the metallic dam enclosure is electrically connected to one or more of the RDL horizontal connections.

3. The die package, as in claim 2, where the RDL horizontal connections is one of the following: a ground plane in one of the RDLs and a ground plane in one of the substrate layers.

4. The die package, as in claim 1, where at one or more of the electrically insulated regions, the metallic dam enclosure is electrically insulated by an insulating layer from one or more of the following: a RDL horizontal connection, a RDL via, a substrate horizontal connection, a substrate via connection, a fanout connection, a connection with a voltage potential, and a connection carrying a signal.

5. The die package, as in claim 4, where the insulating layer is made from one or more of the following: a heat conductive but electrically insulating material, an electrically insulating adhesive, epoxy, resin, dielectric polymer, an electrically insulating thermal interface material (TIM), a polymer adhesive, a dielectric, a polymer, and an undoped semiconductor.

6. The die package, as in claim 1, where there is no clearance between a die bottom surface of one or more of the dies and the top substrate layer.

7. The die package, as in claim 6, where one or more of the die external connections and one or more of the corresponding substrate connections are metallic pad connections connected by hybrid bonding.

8. The die package, as in claim 6, where one or more of the dies is surrounded a high viscosity underfill, the high viscosity underfill being contained by the metallic dam enclosure.

9. The die package, as in claim 8, where the high viscosity underfill has a viscosity higher than 40 pascal-second (Pa-s) and a maximum filler size could be higher than 10 um.

10. The die package, as in claim 1, where the metallic dam enclosure has a height between 400 um and 5 mm and a cross sectional area more than 1.2 mm$^2$.

11. The die package, as in claim 1, where the metallic dam enclosure is made from one or more of the following: copper, aluminum, stainless steel, and graphite.

12. A semiconductor die (die) package comprising:
a substrate having one or more substrate layers, one or more of the substrate layers having one or more substrate connections, the substrate connections being one of a substrate horizontal connection and a substrate via connections, the substrate having a top substrate layer and a substrate bottom layer;
one or more redistribution layers (RDLs), the RDLs being one of the substrate layers, the RDLs having one or more RDL connections, the RDL connections being one of a RDL horizontal connection that is one of the substrate horizontal connections, and a RDL via connection that is of the substrate via connections;
one or more dies disposed on the top substrate layer, each of the dies having a die bottom surface and one or more die external connections, one or more of the die external connections being electrically connected to one or more of the substrate connections being a corresponding substrate connection, a die clearance being between the die bottom surface and the top substrate layer;
one or more metallic dam stiffeners, the metallic dam stiffeners connected together to form a dam enclosure, the dam enclosure disposed on the top substrate layer and enclosing one or more of the dies,
wherein the metallic dam enclosure has one or more electrically connected regions where the metallic dam enclosure is electrically and physically connected to one or more of the substrate horizontal connections and one or more electrically insulated regions where the metallic dam enclosure is electrically insulated from but physically connected to one or more of the substrate horizontal connections and the substrate via connections.

13. The die package, as in claim 12, where a lower viscosity underfill fills the die clearance, surrounds one or more of the dies, and is contained by the dam enclosure.

14. The die package, as in claim 13, further comprising a higher viscosity underfill disposed on the lower viscosity underfill, where the higher viscosity underfill surrounds one or more of the dies and is contained by the dam enclosure.

15. The die package, as in claim 14, where the lower viscosity underfill has a lower viscosity between 2 and 40 pascal-second (Pa-s) and the maximum filler size is less than 10 um and the higher viscosity underfill has a higher viscosity higher than 40 Pa-s and the maximum filler size could be higher than 10 um.

16. The die package, as in claim 12, where one or more of the metallic dam stiffeners provides one or more heat conduction path that conducts heat away from one or more of the dies.

17. The die package, as in claim 12, further comprising:
a heat spreader thermally connected to the dam enclosure; and
a heatsink thermally connected to the heat spreader,
wherein the dam enclosure is part of a thermal path for conducting heat from the die package to the heatsink.

18. A method of making a semiconductor die (die) package comprising the steps of:
forming a release layer on a flat and stiff initial substrate;

forming one or more external package connections on the release layer;

forming a substrate on the release layer, the substrate having one or more substrate layers, one or more of the substrate layers having one or more substrate connections, the substrate connections being one of a substrate horizontal connection and a substrate via connections, the substrate having a top substrate layer;

connecting one or more dies on the top substrate layer;

forming and connecting a dam enclosure on the top substrate layer, the dies being enclosed within the dam enclosure; and depositing one or more underfills within the dam enclosure, the underfills surrounding the dies.

19. The method, as in claim 18, further comprising the steps of:

dicing one or more die packages on the initial substrate, each of the die packages including one or more of the dam enclosures and the dies enclosed within the respective dam enclosures; and detaching the handler by laser ablation.

20. The method, as in claim 18, where the step of depositing one or more underfills, comprises the steps of:

depositing a low viscosity underfill that fills a clearance between a die bottom surface and the top substrate layer; and depositing a high viscosity underfill on the low viscosity underfill.

\* \* \* \* \*